United States Patent [19]
Larkin

[11] 3,985,270
[45] Oct. 12, 1976

[54] EPOXY APPLICATION APPARATUS

[75] Inventor: James T. Larkin, Laguna Hills, Calif.

[73] Assignee: Hughes Aircraft Company, Culver City, Calif.

[22] Filed: Oct. 7, 1975

[21] Appl. No.: 620,432

[52] U.S. Cl. ............................. 222/168; 118/243; 222/342
[51] Int. Cl.² ...................................... B67D 15/00
[58] Field of Search ........... 222/190, 168, 345, 349, 222/346, 342; 118/243, 263; 141/125

[56] References Cited
UNITED STATES PATENTS

| | | | |
|---|---|---|---|
| 2,896,824 | 7/1959 | Sheldon | 222/168 |
| 3,010,427 | 11/1961 | Hautao | 118/243 |
| 3,332,394 | 7/1967 | Cooke | 118/263 |
| 3,834,966 | 9/1974 | Kelley | 118/243 |

*Primary Examiner*—Allen N. Knowles
*Attorney, Agent, or Firm*—Allen A. Dicke, Jr.; William H. MacAllister

[57] ABSTRACT

Epoxy application apparatus is provided to repetitively mechanically dispense the proper quantity and shape of epoxy on the substrate for the repetitive attachment of a small part such as a semiconductor die.

Rotating epoxy pot has its surface refreshed, levelled and height controlled by a doctor or squeegee blade so that a transfer tool can pick up epoxy from the fresh surface behind the squeegee blade and place it on the substrate.

6 Claims, 5 Drawing Figures

EPOXY APPLICATION APPARATUS

BACKGROUND

This invention is directed to an epoxy application apparatus which includes an epoxy pot and a transfer tool to pick up epoxy from the pot and dispense it to the substrate.

Because of the inherent nature of the device and due to the cost of semiconductor material, semiconductor devices are of minimum size. They must be mounted so that connections can be made thereto. In one common mounting, a semiconductor chip is mounted on a frame which is handled as interconnected units along a strip. Each frame carries its semiconductor chip and each chip is supported by the frame and is electrically connected to the dual inline connectors of the frame. A common mounting method is the employment of a gold alloy so that the chip is brazed by this alloy onto its support. Other methods of mounting include low temperature glass and low temperature ceramic bonding, both of which require heat treatment.

Efforts have been made to attach chips or dies with adhesives such as thermo-setting adhesives, such as epoxy. The problem has been to apply the proper amount of the adhesive at the correct place and with the proper configuration of the deposit. The systems presently available for this type of work are generally pneumatic in nature. In these systems epoxy is loaded into a cylindrical dispenser and is sealed from a gas chamber by means of a movable piston. Pressurized gas is pulsed into the chamber by means of a solenoid valve to result in movement of the piston and the expelling of epoxy from an orifice. Such systems are complex and it is difficult to achieve and maintain the proper flow. Of course, there is continuous bleeding of the epoxy from the orifice, even in the absence of pressure discharging, and the result is deposits of poor shape and irregular size.

SUMMARY

In order to aid in the understanding of this invention it can be stated in essentially summary form that it is directed to an epoxy application apparatus which includes a rotating epoxy pot having a squeegee blade therein which continuously smooths and levels the epoxy in the pot for use by a transfer tool which picks up epoxy from the pot and deposits it at the site at which adhesion is to take place.

It is thus an object of this invention to provide an epoxy application apparatus which deposits the correct amount of epoxy in the correct site, and with the correct configuration of the deposit so that reliable attachment of a semiconductor die is achievable at each site. It is a further object to provide an apparatus which provides a uniform source of epoxy and a device which transfers the epoxy to the bonding site. It is another object to provide an apparatus which economically and reliably achieves a repetitive bonding.

Other objects and advantages of this invention will become apparent from a study of the following portion of the specification, the claims and the attached drawings.

DESCRIPTION OF THE PREFERRED EMBODIMENT

Figure 1:
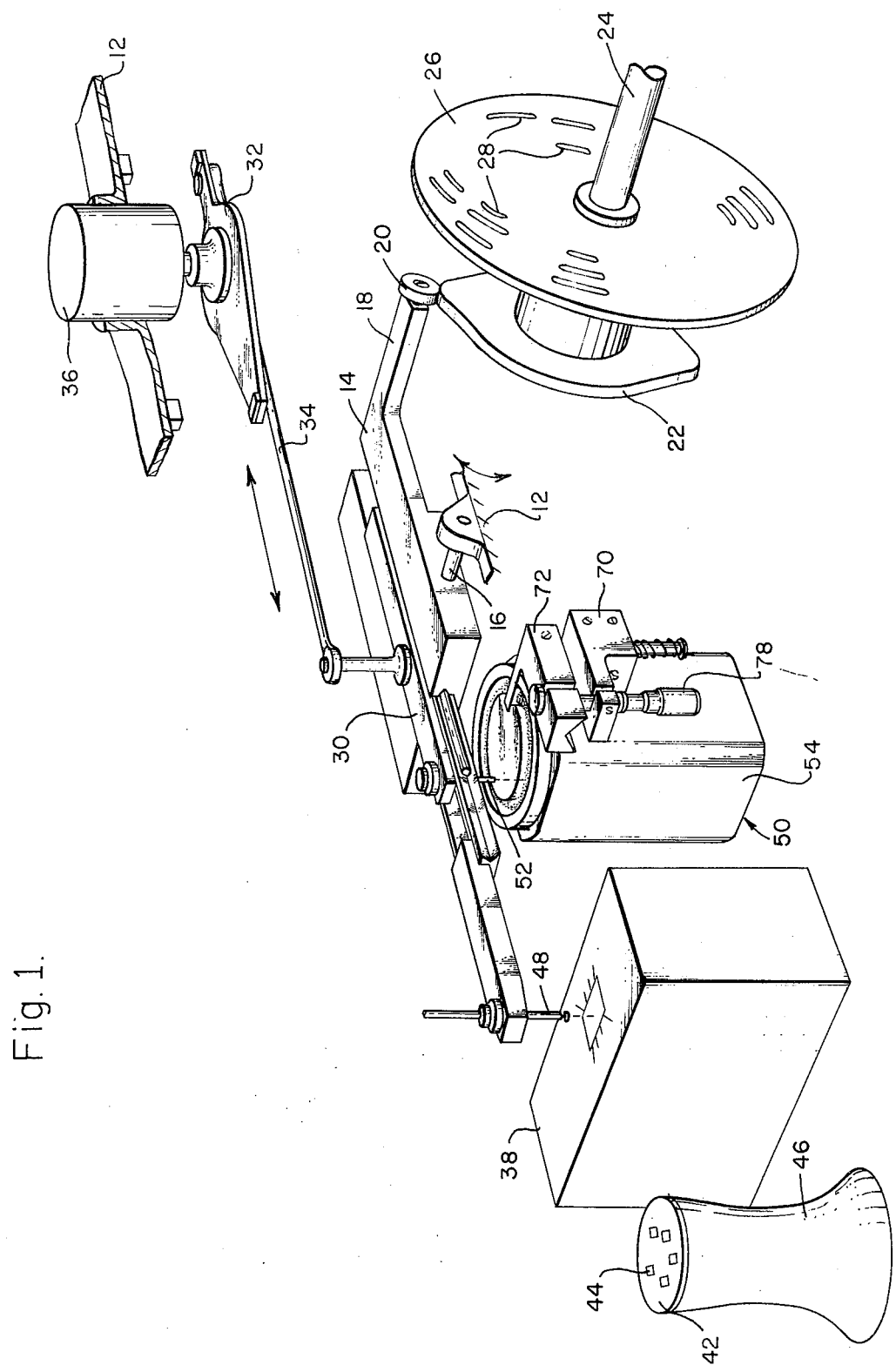
FIG. 1 is a perspective view of the epoxy application apparatus of this invention, with parts broken away to show the functional and structural relationship of the parts, and particularly the epoxy pot.
Figure 3:
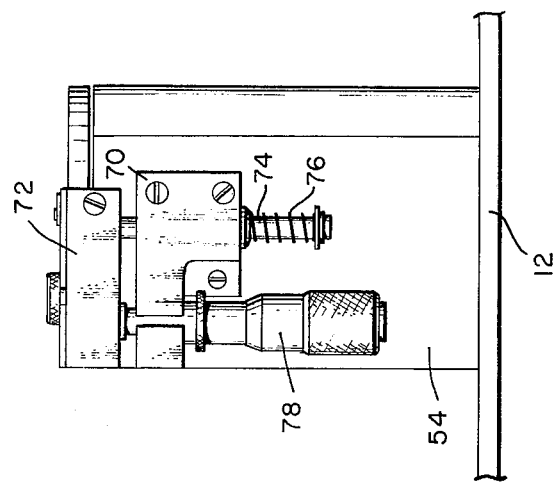
FIG. 3 is a side elevational view thereof.
Figure 2:
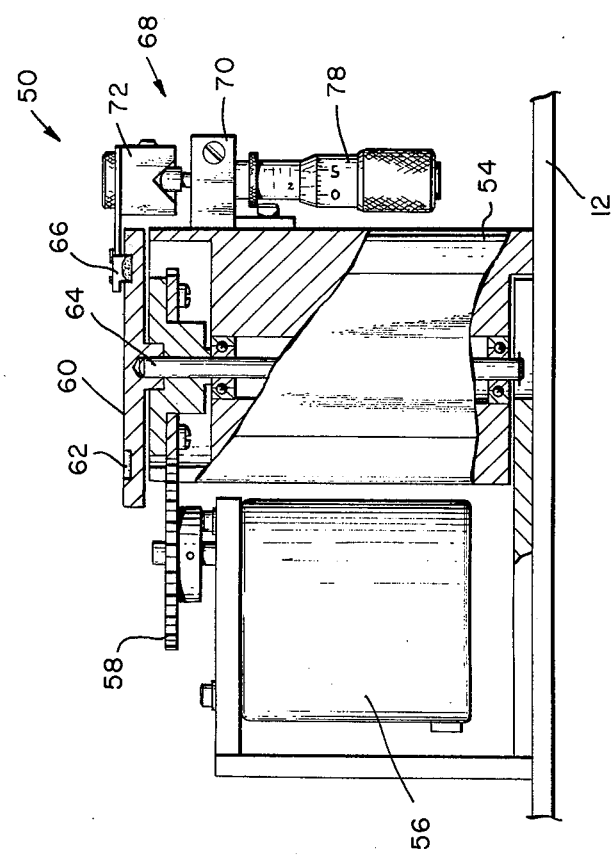
FIG. 2 is a front elevational view, with parts broken away and parts taken in section showing the epoxy pot of the epoxy application apparatus of this invention.
Figure 4:
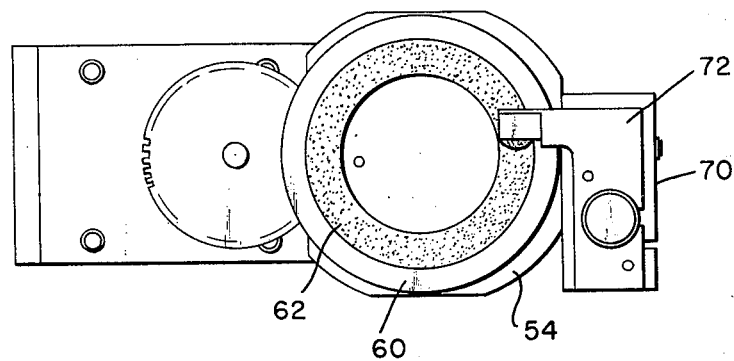
FIG. 4 is a top plan view thereof.
Figure 5:
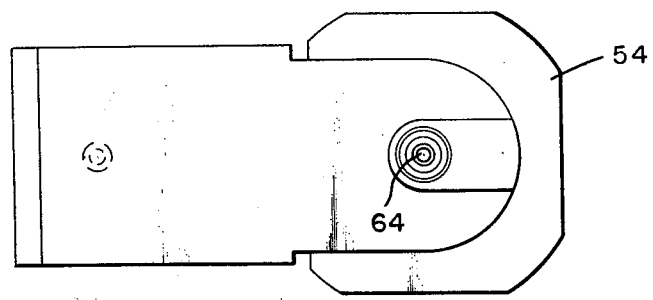
FIG. 5 is a bottom view thereof.

The epoxy application apparatus is generally indicated at 10 in FIG. 1. It has a frame 12 which is mostly broken away in FIG. 1, but which shows as a reference and securement point for all the parts. Carriage 14 is pivoted on trunion 16 on frame 12. Cam follower arm 18 on the carriage carries cam follower 20 on its outer end. Cam follower 20 engages with cam 20 which is mounted on cam shaft 24. Also mounted on cam shaft 24 is control disc 26 which has a plurality of control perforations 28. A light and a light sensor are associated with each circle of control perforations and each light sensor is connected to control of particular functions so that the rotation of cam shaft 24 controls the cycling of the epoxy application apparatus 10. Rotation of cam shaft 24 is controlled by a cam drive stepping motor, not shown, which is controlled by the control disc perforations as well as by other signals.

Slide 30 is mounted for linear motion with respect to carriage 14, on slide ways, linear ball bearings or the like. Linear position of carriage 14 is controlled by crank 32 which is connected by connecting rod 34 to the slide and is rotated by crank motor 36. Crank motor 36 turns a half a turn at a time and is controlled by control disc 26. In the position shown, slide 30 is in its retracted position. It only has the retracted and extended positions as positions of interest in the present apparatus.

The purpose of the present apparatus is to pick up a semiconductor die from a die tray and move it to a frame and adhesively attach it to the frame. This requires mechanism to place the correct amount of adhesive on the frame at the bond site and to move the die from the tray and place it on the adhesive. Frame support 38 supports frame 40 in a particular location. Frame 40 may be one of a continuous strip of frames which are automatically cyclically advanced across frame support 38. It is to frame 40 that the die will be adhesively attached.

Die tray 42 carries dies 44 thereon and is supported by die post 46. Preferably die post 46 is of adjustable height. Since the operator controls the apparatus to pick up the proper die in the proper orientation, it is at the die post that the operator observes machine operation and controls the cycling. Vacuum collet 48 is positioned on the outer end of slide 30. As the slide moves from its innermost position shown in FIG. 1 to its outermost position, vacuum collet 48 moves from a position over frame 40 to a position over die tray 42. Cam 22 holds the vacuum collet raised during its stroking motion and lowers it at each of the sites. Control disc 26 controls the application of the vacuum so that the vacuum collet can pick up a die 44 from the die tray, raise it, carry it inward to a location over frame 40, and lower it to the frame and then turn off the vacuum as the die is depressed into the epoxy deposit or dot on the frame.

Deposition of the epoxy dot onto the frame is accomplished by epoxy dispenser 50 and epoxy transfer tool 52. Epoxy transfer tool 52 is positioned on slide 30 so that when the slide is in the retracted position it is over the epoxy dispenser 50 and when slide 30 is in its extended position it is over frame 40. When slide 30 is lowered in the retracted position the tip of tool 52 dips into the epoxy. The tool is then raised along with the epoxy that adheres to the tip. The tool is then brought over the die site and lowered into contact with the die site on the frame. Due to the surface adhesion of the epoxy, epoxy on the tool will be deposited at the bond site. The configuration of the deposit is of importance. Because of the hemispherical shape of the tip of the epoxy transfer tool 52 and the surface adhesion, a microscopic mountain of epoxy is deposited at the bond site with the peak occurring at the center of the deposit. The tool is raised and returned for a new supply of epoxy, and a die is deposited on the bond site. When the flat surface of the die is brought down to the bond site, the first contact is made with the peak of the epoxy. As the chip continues downward the peak flattens and the epoxy is displaced downward and radially outward to assure a void free epoxy bond.

Epoxy dispenser 50 has base 54 secured to frame 12. Motor 56 is mounted with respect to base 54 and has an output drive gear 58. Epoxy pot 60 has a substantially flat upper surface and has groove 62 therein which serves as the epoxy receiving vessel. Pot 60 is mounted on shaft 64 which is rotatably mounted on bearings in base 54. Gear 66 is secured to shaft 64 and engages with gear 58 so that epoxy pot 60 rotates on the axis of shaft 64. Groove 62 is a groove of revolution about the rotational axis. Doctor blade or squeegee 66 is mounted to squeegee epoxy in groove 62 as epoxy pot 60 rotates. Height of blade 60 above the bottom of grove 62 is controlled by adjustment mechanism 68 mounted on the side of base 54. Mounting block 70 is secured to the side of base 54 and has a guide hole therethrough. Carrier 72 has guide pin 74 thereon which extends through the guide hole in mounting block 70. Compression spring 76 urges carrier 72 downward. Micrometer stop 78 is mounted in block 70 and has a screw engaging under the underside of carrier 72 to hold the carrier at a precise measured and controlled position. Squeegee 66 is mounted on carrier 72 so that controlling micrometer stop 78 controls the depth of epoxy behind the squeegee blade. The freshly squeegeed epoxy presents a fresh surface to the transfer tool and maintains the surface at a predetermined height so that the proper amount of epoxy is picked up with each transfer. The relative height of the various structures is controlled, for example both the vacuum collet 48 and epoxy transfer tool 52 are of adjustable height with respect to alide 30. Also, the height of at least two of the frame support 38, side post 36 and epoxy dispenser 50 is adjustable so that fully interrelated adjustment is achievable.

This invention having been described as preferred embodiment, it is clear that it is susceptible to numerous modifications and embodiments within the ability of those skilled in the art and without the exercise of the inventive faculty. Accordingly, the scope of this invention is defined by the scope of the following claims.

I claim:
1. An adhesive source comprising:
    an adhesive pot having an axis, said adhesive pot being mounted for rotation about said axis, means for rotating said pot about said axis;
    said adhesive pot having a concentric groove therein defined by walls, said walls being spaced away from said axis so that said walls are surfaces of revolution about said axis, said groove being for containing adhesive between its walls;
    squeegee blade means mounted with respect to said walls for leveling the surface of adhesive in said groove as said adhesive pot is rotated on its axis so that a transfer tool can pick up adhesive from a freshly squeegeed and levelled adhesive surface behind said squeegee blade.
2. The adhesive pot of claim 1 wherein said walls include inner and outer walls and a bottom, said inner and outer walls being substantially cylindrical walls with respect to said axis and said bottom being a plane positioned substantially perpendicular to said axis.
3. The adhesive pot of claim 2 wherein said squeegee blade has a lower blade edge parallel to said bottom wall of said groove and said squeegee blade is adjustable in the direction substantially parallel to said axis so that the distance between said bottom wall of said groove and said blade edge can be adjusted to control the height of squeegeed adhesive in said groove behind said squeegee blade.
4. The adhesive pot of claim 3 wherein said squeegee pot has a base and bearings for rotatable mounting of said pot are positioned in said base for the rotatable support of said squeegee pot, a mounting on said base, a micrometer screw on said mounting and a guide pin through said mounting, a carrier mounted on said guide pin and engaged by said micrometer screw, said carrier carrying said squeegee blade so that said squeegee blade is adjustable in respect to said base.
5. An adhesive application apparatus for applying adhesive at a location for the attachment of a part, said apparatus comprising:
    an adhesive dispenser, said adhesive dispenser comprising a rotating pot having an adhesive receptacle therein and a squeegee blade in said receptacle for squeegeeing the adhesive in the receptacle for providing a freshly squeegeed adhesive surface of height determined by the squeegee blade;
    an adhesive transfer tool;
    a location for deposit of adhesive for the later application and adhesive attachment of the part;
    means for placing a portion of the adhesive transfer tool into adhesive in the adhesive dispenser and for moving the adhesive transfer tool to the location for adhesive attachment of the part and for deposition of adhesive from the transfer tool to the location for adhesive attachment of the part.
6. The epoxy application apparatus of claim 5 wherein said vessel is a circular groove concentric about the axis of rotation of said pot and said squeegee is positioned with respect to the walls and bottom of said groove.

* * * * *